United States Patent [19]
Currier et al.

[11] Patent Number: 6,158,032
[45] Date of Patent: Dec. 5, 2000

[54] DATA PROCESSING SYSTEM, CIRCUIT ARRANGEMENT AND PROGRAM PRODUCT INCLUDING MULTI-PATH SCAN INTERFACE AND METHODS THEREOF

[75] Inventors: Guy Richard Currier; Leland Leslie Day; Steven Michael Douskey; Paul Allen Ganfield; James Maurice Wallin, all of Rochester, Minn.

[73] Assignee: International Business Machines Corporation, Armonk, N.Y.

[21] Appl. No.: 09/049,170

[22] Filed: Mar. 27, 1998

[51] Int. Cl.$^7$ ........................................... G01R 31/28
[52] U.S. Cl. .................... 714/726; 714/729; 324/73.1; 324/763
[58] Field of Search .................. 714/726, 727, 714/729; 324/73.1, 763

[56] References Cited

U.S. PATENT DOCUMENTS

| | | | |
|---|---|---|---|
| 4,639,919 | 1/1987 | Chang et al. | 371/27 |
| 5,150,044 | 9/1992 | Hashizume et al. | 324/158.1 |
| 5,640,337 | 6/1997 | Huang et al. | 364/578 |
| 5,657,328 | 8/1997 | Swoboda | 714/726 |
| 5,668,817 | 9/1997 | Adham | 371/224 |
| 5,724,502 | 3/1998 | Cherichetti et al. | 395/183.04 |
| 5,768,152 | 6/1998 | Battaline et al. | 364/551.01 |
| 5,809,036 | 9/1998 | Champlin | 371/22.31 |
| 5,848,264 | 12/1998 | Baird et al. | 395/500 |
| 5,862,152 | 1/1999 | Handly et al. | 371/22.32 |
| 5,969,538 | 10/1999 | Whetsel | 324/763 |
| 5,974,578 | 10/1999 | Mizokawa et al. | 714/727 |
| 5,991,898 | 11/1999 | Rajski et al. | 714/30 |
| 6,000,051 | 12/1999 | Nadeau-Dostie et al. | 714/727 |

OTHER PUBLICATIONS

Chandramouu, R. et al., "Testing systems on a chip", *IEEE Spectrum*, (Nov., 1996), pp. 42–47.

Day, L.L. et al., "Micro Token Ring", *IBM® Technical Disclosure Bulletin*, vol. 37, No. 9, (Sep., 1994), pp. 485–486.

Whetsel, Lee, *Built–in Self–Test (BIST) Using Boundary Scan*, Texas Instruments Incorporated, SCTA043A, (Dec. 1996).

Whetsel, Lee, *Hierarchically Accessing 1149.1 Applications in a System Environment*, Texas Instruments Incorporated, SCTA033, Proceedings of International Test Conference, Baltimore, MD (Oct. 17–21, 1993), IEEE reprinted with permission (1993), pp. 1–12.

Texas Instrument Incorporated, *'ABT8996 Addressable Scan Port (ASP) Product Literature*, (1996).

Texas Instruments Incorporated, *IEEE1149.1 (JTAG) Boundary–Scan Logic Products Literature*, SCTB042, (1996).

Texas Instruments Incorporated, *SN54ABT8995, SN74ABT8996 10–Bit Addressable Scan Ports Multidrop–Addressable IEEE STD 1149.1 (JTAG) TAP Transceivers Product Information*, SCBS489B—Aug. 1994 (Rev. Dec. 1996), pp. 1–40.

Texas Instruments Incorporated, *Data Formats*, http://www.ti.com/sc/docs/jtag/format.htm (downloaded Nov. 21, 1997).

Texas Instruments Incorporated, *IEEE Std 1149.1 (JTAG) Testability Primer*, Semiconductor Group (1997).

*Primary Examiner*—Emmanuel L. Moise
*Attorney, Agent, or Firm*—Wood, Herron & Evans, LLP

[57] ABSTRACT

A data processing system, circuit arrangement, program product, and method thereof utilize a multi-path scan interface that is capable of providing multiple scan paths into a plurality of scan ring segments in an integrated circuit device. The multi-path scan interface utilizes one or more multiplexers coupled between scan in and scan out ports and at least one scan ring segment to provide alternate scan paths depending upon select signals supplied to each multiplexer. With such a configuration, a standardized scan interface may developed for interfacing with a wide variety of scan ring segments, and optionally, for multiple purposes. As a result, the amount of custom circuitry necessary to provide access to scan ring segments is significantly reduced.

37 Claims, 7 Drawing Sheets

DATA PROCESSING SYSTEM, CIRCUIT ARRANGEMENT AND PROGRAM PRODUCT INCLUDING MULTI-PATH SCAN INTERFACE AND METHODS THEREOF

CROSS-REFERENCE TO RELATED APPLICATIONS

This application is related to U.S. Ser. No. 09/035,490, filed on Mar. 5, 1998 by Steven Michael Douskey et al., and entitled "DATA PROCESSING SYSTEM AND INTEGRATED CIRCUIT INCLUDING SERVICE INTERFACE FOR ACCESSING A PLURALITY OF CORES AND METHODS THEREOF", which application is incorporated by reference herein.

FIELD OF THE INVENTION

The invention is generally related to integrated circuit device architecture and design, and in particular to the architecture and design of a scan interface for an integrated circuit device.

BACKGROUND OF THE INVENTION

Integrated circuit devices, commonly known as chips, continue to become more powerful and complex as semiconductor manufacturing technologies have advanced. Whereas early integrated circuit devices included fewer than one hundred transistors, it is now common to integrate several million transistors into a single integrated circuit device. This increased transistor count enables some operations that once required several integrated circuit devices to now be implemented in a single integrated circuit device, often providing greater performance at a lower cost. For example, where previously a data processing system might require separate integrated circuit devices for a microprocessor, a memory, a bus interface, and a memory controller, advances in chip density now permit all of these functions to be integrated into the same integrated circuit device. Such devices are typically known as "systems on a chip" due to the high level of integration they provide.

Increases in chip density have also significantly affected the design methodology for integrated circuit chips. Rather than laying out individual transistors in a design, more complex devices are typically designed by assembling together multiple predefined "cells" of transistors that are obtained from a library, and that have previously been optimized and tested prior to use in the design. The functionality and complexity of individual cells continue to increase to the extent that particularly complex cells are often referred to as "embedded cores", or simply cores. Whereas many cells may represent relatively simple functions such as those of a logical AND gate or a multiplexer, a core typically represents a more complex function such as that of a processor, a controller, a memory, an interface circuit, or any other complex data processing circuit arrangement.

Another net effect of the increase in the complexity of integrated circuit devices is that testing of the manufactured devices has become significantly more complex and time consuming. For example, a device may be designed with a boundary scan architecture integrated therein with one or more serial chains of registers coupled to the I/O pins of a device. The registers in a serial chain, or scan path, are designed such that, when configured in a specific mode, the registers together operate as a shift register so that data may be shifted into the chain of registers from a single source to simulate different conditions, and so that data generated within a device may be shifted out through a single output. Thus, with a boundary scan architecture, the current state of various pins in a device at any given time may be recorded and later accessed via external equipment to verify the operation of a manufactured device.

In addition, built-in self-test (BIST) circuitry may also be incorporated into individual devices to perform predetermined testing operations, e.g., upon power-up of a device. For example, for logic devices such as processors and controllers, logical built-in self-test (LBIST) circuitry may be used to apply pseudo-random test patterns to logic gates to verify their correct operation.

Furthermore, beyond LBIST it may be desirable to access individual registers within an integrated circuit device during the functional mode of operation of the device to perform various service-related functions. For example, a standard interface, known as the Joint Test Action Group (JTAG) interface (IEEE Std. 1149.1) has been developed to facilitate external access to integrated circuit devices. With a JTAG-compatible integrated circuit device, a standardized test access port (TAP) is provided that permits boundary scan operations to be performed in response to commands issued by an external TAP controller through the TAP port of the device, with the results output back through the same port.

For each of these service and test-related operations, registers within an integrated circuit device are often grouped into serial scan chains, also referred to herein as scan ring segments. One or more interfaces, also referred to as scan interfaces, are typically provided to provide external access to the scan chains in an integrated circuit. Within such interfaces, one or more scan paths are defined, representing a data path beginning at an input port, through one or more scan chains, and terminating at an output port.

The number and length of scan chains, however, can vary significantly for any given integrated circuit design, e.g., based upon the number of registers to be scanned, the breakdown of registers based upon common functionality and/or clock domain, etc. Moreover, given that the registers of many integrated circuit designs may need to be accessed for multiple purposes, e.g., during testing of manufactured devices, during LBIST, and/or during performance of service-related functions while in functional modes of operation, etc., different combinations and/or numbers of scan chains may be optimal for different purposes. For example, where grouping one collection of registers into a scan chain may be optimal for LBIST, it may be optimal for service-related functions to group some of the registers in the collection in other scan chains.

Given the relatively large number of variables associated with grouping registers into one or more scan chains, a relatively large amount of custom logic is often required to provide a suitable scan interface with the registers in an integrated circuit design. Designing and verifying the operation of custom logic, however, can significantly impact the cost and development time for an integrated circuit. Moreover, when registers may need to be accessed for multiple purposes, multiple custom scan interfaces may also need to be developed, which only further increases the cost and effort associated with designing and verifying an integrated circuit design.

Therefore, a significant need exists for an improved manner of designing and providing access to registers arranged in scan chains within an integrated circuit device. Moreover, a significant need exists for an improved manner of optimizing the access to such registers for multiple purposes.

SUMMARY OF THE INVENTION

The invention addresses these and other problems associated with the prior art by providing a data processing system, circuit arrangement, program product, and method thereof utilizing a multi-path scan interface that is capable of providing multiple scan paths through a common set of scan ring segments in an integrated circuit device. The multi-path scan interface utilizes one or more multiplexers coupled between scan in and scan out ports and a plurality of scan ring segments to provide alternate scan paths depending upon select signals supplied to each multiplexer. With such a configuration, a standardized scan interface may be developed for interfacing with a wide variety of scan ring segments, and optionally, for multiple purposes. As a result, the amount of custom circuitry necessary to provide access to scan ring segments is significantly reduced.

Consistent with one aspect of the invention, first and second scan ring segments, each including an input and an output, have coupled therebetween a multiplexer configured to selectively couple the output of the first scan ring segment to the input of the second scan ring segment. Using this configuration, in a first mode of operation of the multiplexer, the first and second scan ring segments are configured to operate in a common scan path. On the other hand, in a second mode of the multiplexer, the first and second scan ring segments are configured to operate in separate scan paths.

Consistent with another aspect of the invention, a scan in port and a scan out port are provided with a scan path defined therebetween, with a scan ring group disposed within the scan path between the scan in port and the scan out port, the scan ring group including an input and an output and at least a first scan ring segment with an input and an output, and with a second scan ring segment having an input and an output disposed in the scan path between the scan ring group and one of the scan in and scan out ports. A multiplexer includes first and second inputs and an output, with the first and second inputs of the multiplexer respectively coupled to the input and output of the scan ring group, and with the output of the multiplexer coupled to one of the input of the second scan ring segment and the scan out port. Using this configuration, in a first mode of operation, the multiplexer couples the first input to the output to bypass the scan ring group from the scan path, and in a second mode of operation, the multiplexer couples the second input to the output to include the scan ring group in the scan path.

These and other advantages and features, which characterize the invention, are set forth in the claims annexed hereto and forming a further part hereof. However, for a better understanding of the invention, and of the advantages and objectives attained through its use, reference should be made to the Drawing, and to the accompanying descriptive matter, in which there is described exemplary embodiments of the invention.

DETAILED DESCRIPTION

Figure 1:
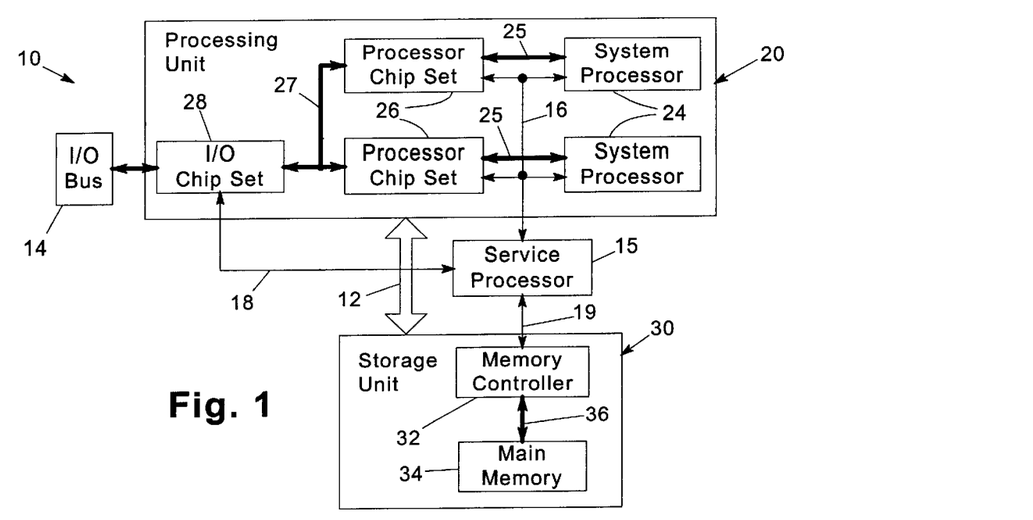
FIG. 1 is a block diagram of a data processing system consistent with the invention.

Turning to the Drawing, wherein like numbers denote like parts throughout the several views, FIG. 1 illustrates the general configuration of an exemplary data processing system 10 suitable for implementation of a multi-path scan interface consistent with the invention. System 10 generically represents any of a number of multi-user or stand-alone computer systems such as network servers, midrange computers, mainframe computers, workstations, desktop computers, portable computers, and the like. Data processing system 10 may also be implemented in other types of computing devices, e.g., in embedded controls for any number of electronically-controlled devices. One suitable implementation of data processing system 10 is in a midrange computer such as the AS/400 computer available from International Business Machines Corporation.

Data processing system 10 generally includes a processing unit 20 coupled to a storage unit 30 through a bus 12. Within processing unit 20 may be one or more system processors 24, as well as necessary support circuitry for each processor, e.g., as represented by chip set blocks 26 coupled to processors 24 by buses 25. Also shown is an input/output (I/O) chip set 28, coupled to the processor chip set blocks 26 over a bus 27, that handles interface with an I/O bus 14. Other support circuitry, e.g., to handle network and/or terminal interfaces, power management, mass storage, etc. may also be incorporated into processing unit 20.

Storage unit 30 typically includes a memory controller 32 that provides an interface between processing unit 20 and a main memory 34 for the data processing system. Memory 34, which is coupled to controller 32 over a bus 36, is typically a bank of random access memory, although in the alternative, a memory may be implemented in local or mass storage devices such as hard disk drives, magnetic tapes, CD-ROMs, and a multitude of other storage media.

System 10 also includes a service processor 15 coupled to each of blocks 24, 26, 28 and 32 through buses 16, 18 and 19. Service processor 15 typically handles non-functional operations such as the configuration, testing and/or initialization of various components in data processing system 10.

It should be appreciated that the various blocks described in processing unit 20 and storage unit 30, as well as other blocks in the data processing system, may be implemented using one or more integrated circuit devices. Typically, any of these devices may implement a multi-path scan interface consistent with the invention. As such, it should be appreciated that the invention should not be limited to use with any particular design or end use of an integrated circuit device.

As is known in the art, integrated circuit devices are typically designed and fabricated using one or more computer data files, referred to herein as hardware definition programs, that define the layout of the circuit arrangements on the devices. The programs are typically generated by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. While the invention has and hereinafter will be described in the context of fully functioning integrated circuit devices and data processing systems utilizing such devices, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links.

Figure 2:
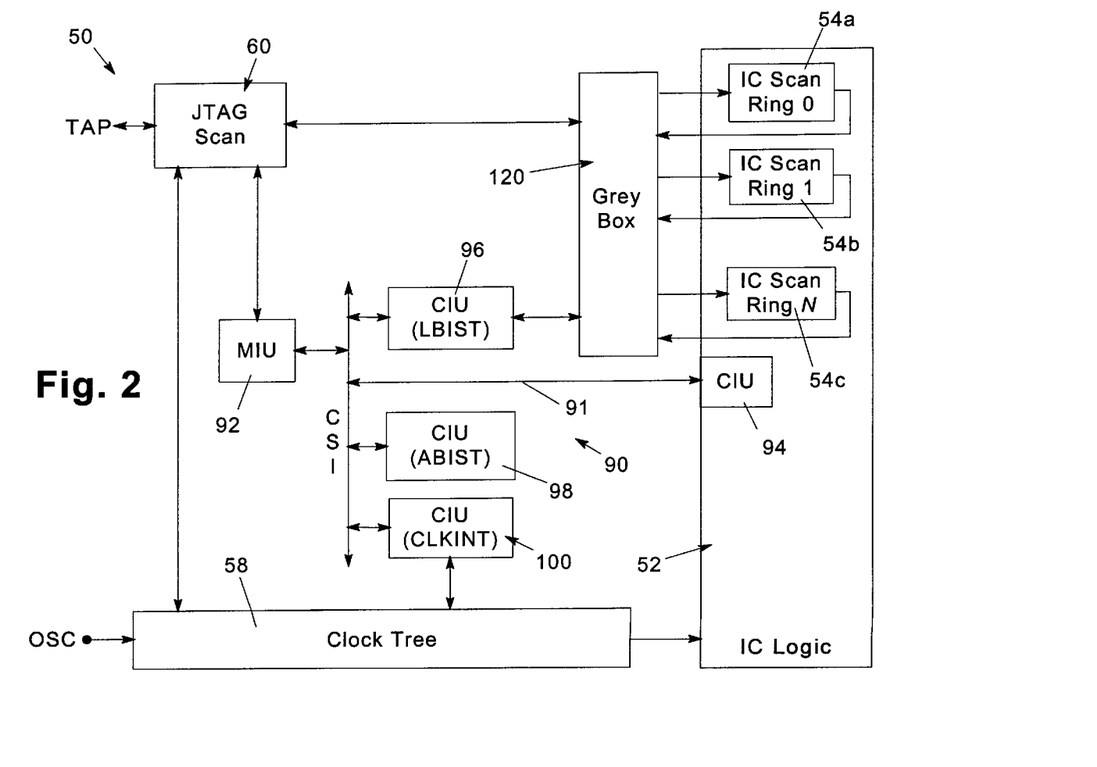
FIG. 2 is a block diagram of a circuit arrangement for an integrated circuit device from the data processing system of FIG. 1, illustrating a multi-path scan interface for use therewith.

FIG. 2 illustrates the configuration of one such integrated circuit device 50 consistent with the invention. Device 50 generally includes integrated circuit logic 52 with a circuit arrangement that performs one or more functional tasks in device 50. Moreover, as discussed below, logic 52 may also be implemented using multiple cores.

Consistent with the invention, logic 52 may include one or more scan ring segments used in built-in self test (BIST) and other service-related functions (discussed in greater detail below), e.g., scan ring segments 54a–54c (also denoted herein as scan ring segments 0.N). A scan ring segment generally includes a serial arrangement of registers within the logic that, when operated in a particular mode, may be used to pass information along a scan path formed by the registers. It should be appreciated that the number of registers, number of scan ring segments, and arrangement of scan ring segments and/or of registers within the scan ring segments is highly dependent upon the particular circuit arrangement in logic 52, as well as the desired service-related functions to be implemented through the scan interface.

One or more clock signals are provided to logic circuitry 52 through a clock tree 58, the implementation of which is highly dependent upon the particular design of logic 52, the number and types of clock signals required, etc. Tree 58 receives one or more raw clock signals, represented by the OSC input, that are distributed throughout device 50 in a manner known in the art.

The performance of service-related functions on device 50 may be initiated, and the results therefrom obtained, through a service interface coupled to a service access port, which may optionally be coupled to a service processor. In the illustrated embodiment, a service interface compliant with the Joint Test Action Group (JTAG) standard (IEEE Standard 1149.1) is used, and as such, the service access port may be implemented as a test access port (TAP) controlled via a JTAG scan controller 60. It should be appreciated, however, that other interface configurations may be used in the alternative, and thus, the invention should not be limited to any particular service interface implementation.

Controller 60 communicates with clock tree 58, as well as with a core service interface 90 that may be implemented in the manner described in the aforementioned and herein incorporated application entitled "DATA PROCESSING SYSTEM AND INTEGRATED CIRCUIT INCLUDING SERVICE INTERFACE FOR ACCESSING A PLURALITY OF CORES AND METHODS THEREOF." Generally, interface 90 includes a bus 91 that couples a master interface unit (MIU) 92 to a plurality of core interface units (CIU's), e.g., core interface units 94, 96, 98 and 100, disposed in device 50.

MIU 92 is principally used to pass requests received externally from device 50 through controller 60 to one or more of the CIU's so that predetermined service operations may be performed by the CIU's as required. The CIU's may be more specifically designed to perform predetermined services or operations consistent with the invention, e.g., to function as test controllers, among others. For example, CIU 96 is illustrated as a logic built-in self-test (LBIST) controller that is used to perform testing of logic circuitry within logic 52. As another example, CIU 98 is configured as an array built-in self-test (ABIST) controller that is used to perform testing of array elements such as embedded memories. Another variation of a core interface unit is a clock interface controller 100, which is utilized to control clock tree 58, among other functions.

CIU's 96, 98 and 100 may be utilized to control all of the logic in device 50, including multiple cores if such cores exist. Moreover, as illustrated by CIU 94, it may be desirable to utilize core-specific CIU's, which may be, among other components, core-specific implementations of LBIST, ABIST, and clock interface controllers. The precise manner of performing and implementing LBIST, ABIST and clock interface operations is generally well-known in the art, and the reader is directed to the aforementioned incorporated application for a more detailed discussion of these components, as well as the interaction of these components with logic in the integrated circuit device.

Consistent with the invention, a multi-path scan interface may be implemented using a grey box 120 coupled between controller 60, LBIST CIU 96, and each scan ring segment 54a–54c in logic 52. As discussed in greater detail below, grey box 120 permits multiple scan paths to be defined using one or more of scan ring segments 54a–54c.

Figure 3:
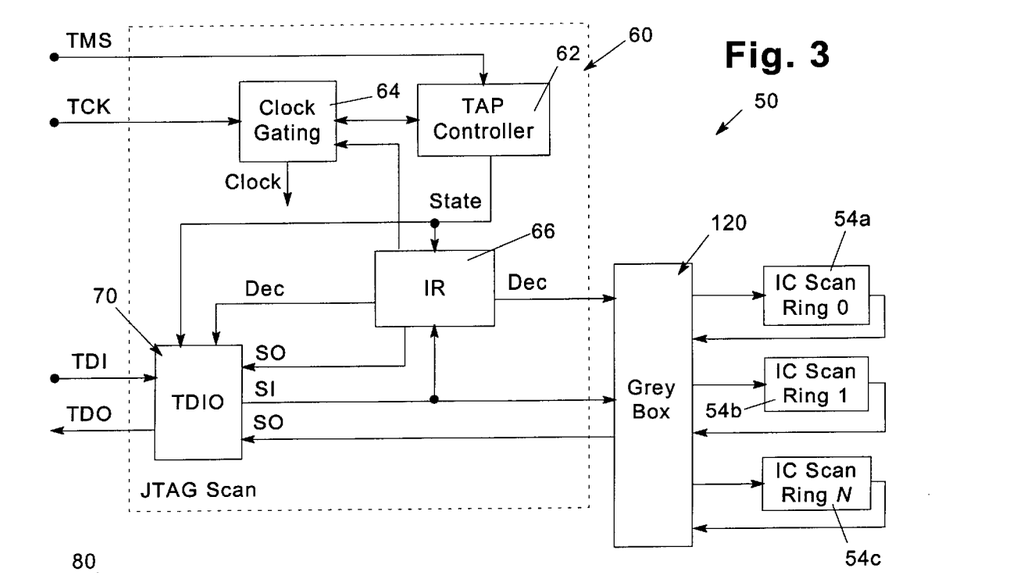
FIG. 3 is a block diagram illustrating in greater detail the JTAG scan block of FIG. 2.

FIG. 3 illustrates JTAG scan controller 60 in greater detail. Controller 60 provides an interface with a JTAG-compliant test access port (TAP), which is a four-signal interface including a Test Mode Select (TMS) signal, Test Clock (TCK) signal, Test Data In (TDI) signal and Test Data Out (TDO) signal, as is well known in the art. The TMS signal is processed by a Test Access Port (TAP) controller 62, and the TCK signal is received by clock gating circuitry 64. TAP controller 62 includes a sequencer that handles the interface with a JTAG bus through the test access port, a process that is well known in the art, e.g., as described in the IEEE 1149.1 Standard.

Controller 62 relies on several components, including clock gating circuitry 64, a Test Data Input/Output selector (TDIO) 70, and an Instruction Register (IR) 66. Additional components, e.g., a set of Test Data Registers (TDR's) and an interface with the CSI bus through MIU 92, may also be provided, but are not shown in FIG. 3. One TDR is implemented via grey box 120 to permit information to be scanned into and/or out of the various scan ring segments 54a–54c, as will be discussed in greater detail below.

Clock gating circuitry 64 is controlled by controller 62 and the active instruction in IR 66 to control the supply of clock signals from the TCK signal to clock tree 58. IR 66 receives state information from controller 62, and supplies decode signals to TDIO 70 and grey box 120. Various instructions, many of which are dictated by the JTAG standard, may be processed by controller 60 via this arrangement.

TDIO 70 is used to route scan data to and from the JTAG bus. Specifically, scan in (SI) and scan out (SO) paths are defined between TDIO 70 and each of IR 66 and grey box 120, so that external data may be scanned into the integrated circuit from the JTAG Test Data In (TDI) signal and internal data may be scanned out of the integrated circuit to the JTAG Test Data Out (TDO) signal.

Figure 4:
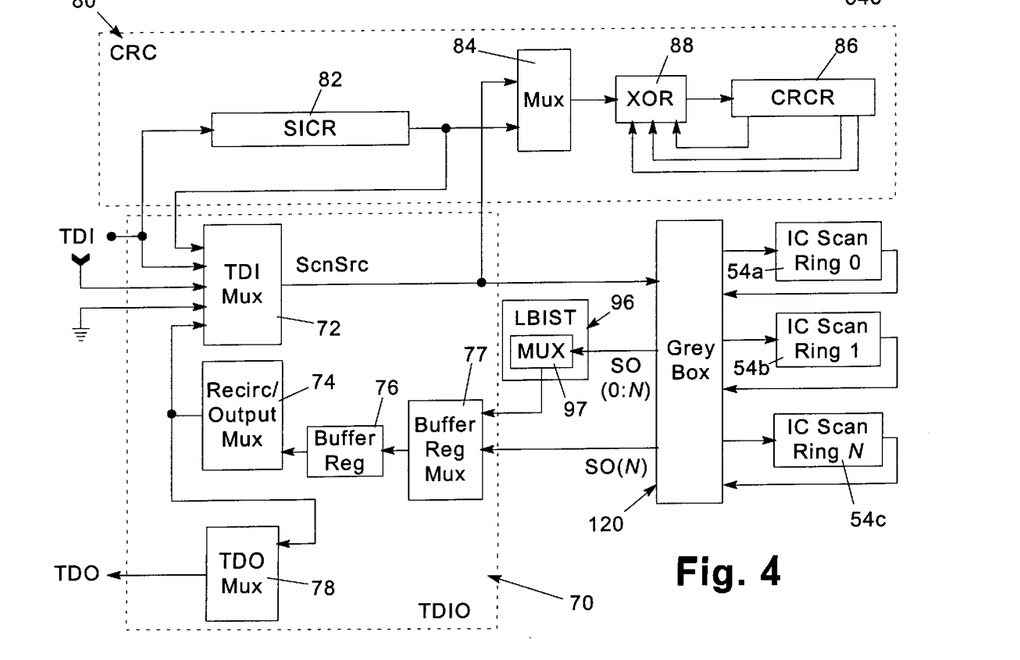
FIG. 4 is a block diagram illustrating in greater detail the TDIO block of FIG. 3.

FIG. 4 illustrates TDIO 70 in greater detail. TDIO 70 is responsible for routing scanned data to and from scannable registers internal to controller 60 as well scan ring segments via TDI and TDO signals. TDIO 70 includes a buffer register 76 and four multiplexers 72, 74, 77 and 78. Multiplexer 72, also referred to as a TDI multiplexer, output one of several input signals as a scan source (ScnSrc) signal that is supplied to grey box 120 and represents the scan in data to supply to the scan ring segments. Multiplexer 72 receives logic "1" and logic "0" inputs to permit scan ring segments to be flushed with all "0's" or "1" as desired. To this extent, multiplexer 72 operates as a reset circuit arrangement that provides flush signals to each of the scan ring segments when so configured. Multiplexer 72 also receives as input the TDI signal from the JTAG bus.

The TDI signal is also provided to a cyclic redundancy check (CRC) partition 80 including a scan in check register (SICR) 82, a multiplexer 84, a CRC register (CRCR) 86 and an exclusive-OR gate 88. As discussed above, the input to SICR 82 is coupled to the TDI signal from the JTAG bus, and the output is coupled to another input of TDI multiplexer 72. Multiplexer 84 selects between the output of SICR 82 and the ScnSrc signal from TDI multiplexer 72. This output is supplied to exclusive-OR gate 88, which outputs to CRCR 86. CRCR 86 may be, for example, a 32-bit (CRC) register implemented as a Linear Feedback Shift Register (LFSR) with exclusive-OR'ed tap points at bits 9, 29, 30 and 31. In this arrangement, it is possible for checksums appended to the end of a scan-in instruction to be loaded into SICR 82 and compared with a checksum in CRCR 86 to determine if a miscompare has occurred, and that the data is invalid. It will be appreciated that the implementation and use of a CRC partition is, in general, well within the abilities of one of ordinary skill in the art.

Buffer register multiplexer 77 of TDIO 70 receives a scan out signal from grey box 120, designated SO (N), representing the primary scan out for grey box 120, as well as an additional scan out path from a multiplexer 97 in LBIST 96 that selects one of a plurality of scan out signals, or channels, designated SO (0:N). Multiplexer 77 may also receive the output of the previous scan ring segment in a scan path, so that all of the scan ring segments with access via grey box 120 may be bypassed in a scan path.

Multiplexer 77 outputs to a 1-bit buffer register 76 that is utilized to assist in the timing configuration of the integrated circuit, as well as with the timing for the TDO signal. Without the register, it is possible for a timing tool to see a continuous loop in the integrated circuit device even though in practice such a continuous loop would not be formed due to gating logic in the integrated circuit device.

Register 76 outputs to a recirculation/output multiplexer 74, which also receives the scan out signals from various test data registers (TDR's) that may be implemented elsewhere on the integrated circuit device—specifically, the TDR's comprising the JTAG/Test circuitry itself. In addition, the scan out signal from a scan register within MIU 92 may also be coupled to this multiplexer to permit CSI operations to be output through the JTAG bus. Multiplexer 74 outlets to a TDO multiplexer 78, as well as provides a recirculation path back to TDI multiplexer 72. The recirculation path permits data within the scan ring segments to be scanned out via the TDO signal, but then refreshed back into the scan ring segments as if the data were being supplied through the TDI signal. Also, in a scan out process, the scanned out data is scanned back through multiplexer 72 and to CRC partition 80 to generate a CRC that may be later scanned out using a scan instruction from CRCR 86 if it is desirable to check for a CRC miscompare.

TDO multiplexer 78 receives as input the output of multiplexer 74. Multiplexer 78 may also receive the scan out path from instruction register 66. The output of this multiplexer is the TDO signal for the JTAG bus.

Figure 5:
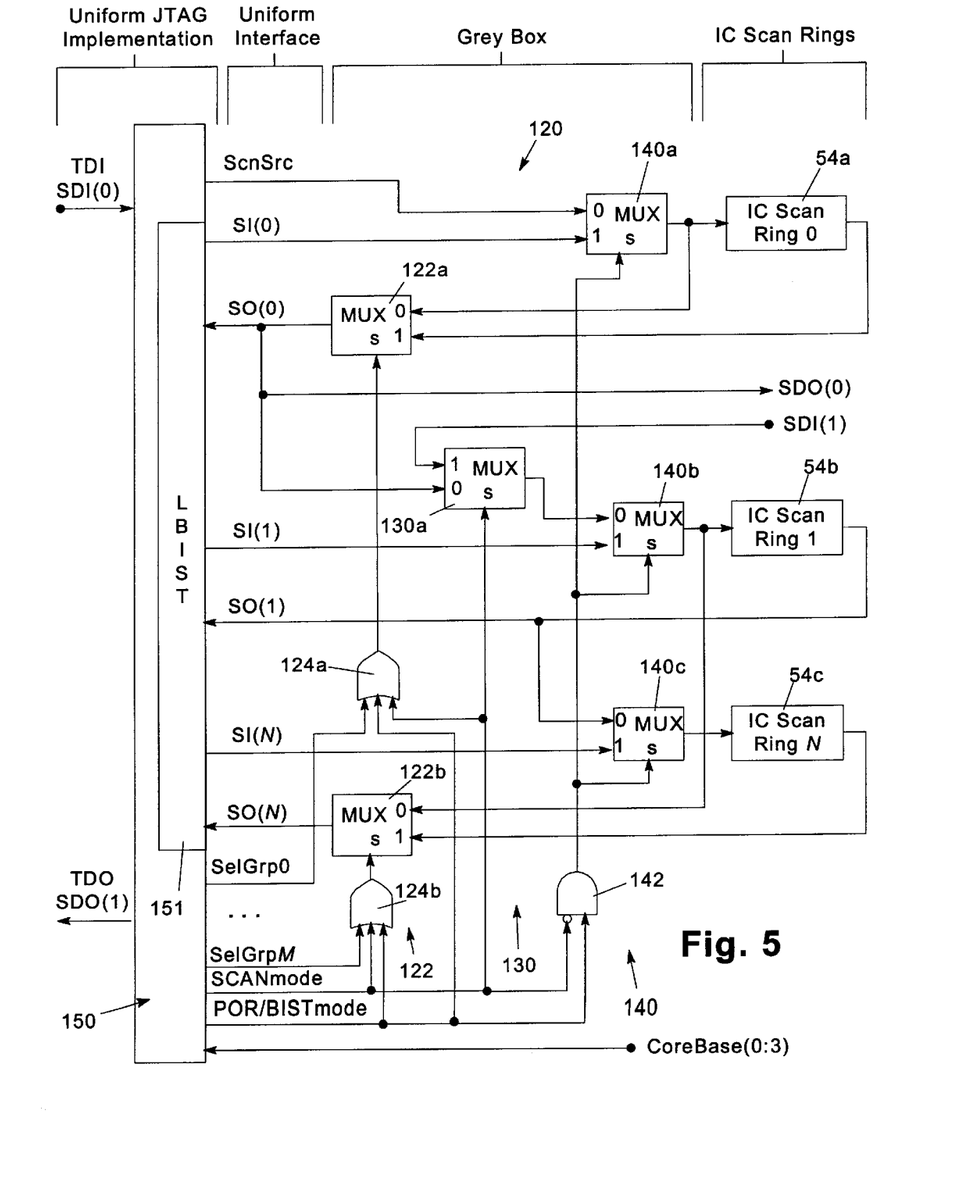
FIG. 5 is a block diagram illustrating in greater detail the grey box of FIG. 2.

FIG. 5 illustrates one suitable implementation of grey box 120 consistent with the invention. As will become apparent below, through the use of a multiplexer structure interposed between a series of scan ring segments and a uniform scan interface, such as the JTAG interface, various configurations of serial and/or parallel scan paths may be enabled to permit flexible utilization of the various scan ring segments disposed on an integrated circuit device. As a result, this permits a uniform scan interface to be interfaced with a specific logic design without requiring re-design of the primary components of the scan interface. As a result, both design time and complexity are reduced through a flexible interface suitable for a number of different applications.

For the purpose of simplicity, grey box 120 is shown coupling scan rings 54a–54c to a JTAG implementation 150, including an LBIST controller 151. It should be appreciated that JTAG 150 may be configured as shown in FIGS. 2–4, as well as other possible configurations. JTAG implementation 150 is illustrated as receiving a TDI signal and outputting a TDO signal, e.g., through a standard JTAG bus. A uniform interface with grey box 120 is provided, including the scan source signal ScnSrc, and a series of 0:N scan in/scan out (SI/SO) pairs. To control the interface with scan ring segments 54a–54c, a number of control signals are provided to reconfigure grey box 120 to form different combinations of scan paths. A parallel scan mode signal, also referred to as a POR/BISTmode signal, is utilized during power on reset or during LBIST operation to configure each scan ring segment 54a–54c to operate in a separate but parallel scan path. An external scan mode signal, also referred to as a SCANmode signal, is utilized to select an external scan mode, discussed in greater detail below. In addition, a series of scan group select group signals SelGrp 0:N are used to selectively bypass or include scan groups, each including one or more individual scan ring segments, within a scan path defined between the TDI and TDO signals when the device is operating in a functional mode. Moreover, a CoreBase signal 0:3 is typically a hard-coded core identifier of the particular core within which scan rings 54a–54c are utilized, which enables identification of the scan ring segments external to grey box 120. It should be appreciated, however, that the signal may be omitted if a single-core design is utilized.

A series of "functional" multiplexers 122, e.g., multiplexers 122a and 122b, each receive as input the input and output of a scan ring segment group. For example, for multiplexer 122a, a first scan group including scan ring segment 54a is provided, whereby the input and output of segment 54a is supplied to multiplexer 122a. The multiplexer outputs to the input of the next scan group, and receives as its selection signal the output of an OR gate 124a that activates the multiplexer to bypass the scan ring segment in response to activation of any of the PORlBISTmode, SCANmode and SelGrp0 signals. Similarly, multiplexer 122b gates a second scan group including both of scan rings 54b and 54c, and thus receives as input the input to scan ring segment 54b and the output of scan ring segment 54c. The output of the multiplexer is coupled to the last scan out signal, and selection of the input is performed via a selection signal output from an OR gate 124b that also receives the POR/BISTmode and SCANmode signals, as well as another select group (SelGrpM) signal.

A second series of multiplexers are designated as "external" multiplexers 130, including multiplexer 130a. This type of multiplexer is utilized to select an "external" mode of operation whereby one or more external scan ring paths are defined between pairs of external pins on the integrated circuit device. A first external scan path is shown including scan ring segment 54a, with the TDI pin doubling as the external scan in pin, denoted SDI(0). The output of this external scan path is an additional external pin SDO(0). A second external scan path includes scan ring segments 54b and 54c, and includes an external scan in pin SDI(1), with the TDO pin doubling as the second scan out pin SDO(1). Multiplexer 130 is responsive to the SCANmode signal, and receives as input the output of multiplexer 122a, as well as that of external pin SDI(1).

A third series of multiplexers are denoted "POR/BIST" multiplexers 140, e.g., multiplexers 140a, 140b and 140c. Each multiplexer outputs to a corresponding scan ring segment 54a, 54b and 54c, and each is responsive to a select signal provided through an AND gate 142 that is asserted in response to the POR/BISTmode signal being active and the SCANmode signal being inactive. Each multiplexer is configured to receive either the output of the previous scan ring segment, or for the first multiplexer 140a, the ScnSrc signal output from implementation 150. Each multiplexer also receives an alternate input that is the scan in (SI) signal for each parallel scan path defined for the POR/BIST mode of operation.

Figure 6:
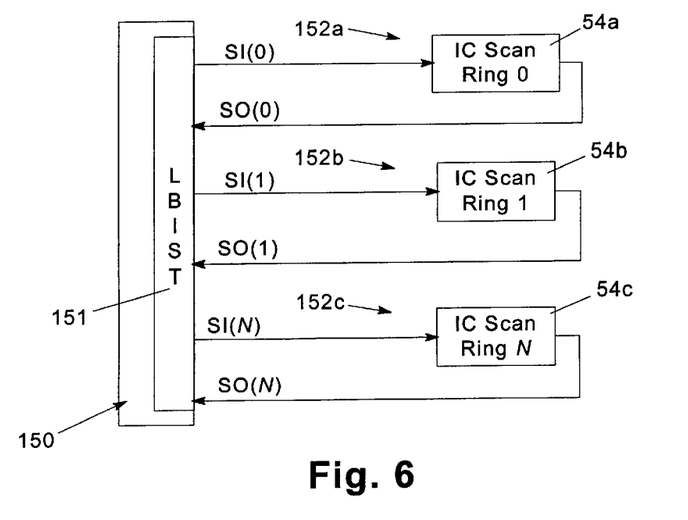
FIG. 6 is a block diagram illustrating a first configurable scan path arrangement for the grey box of FIG. 5.
Figure 7:
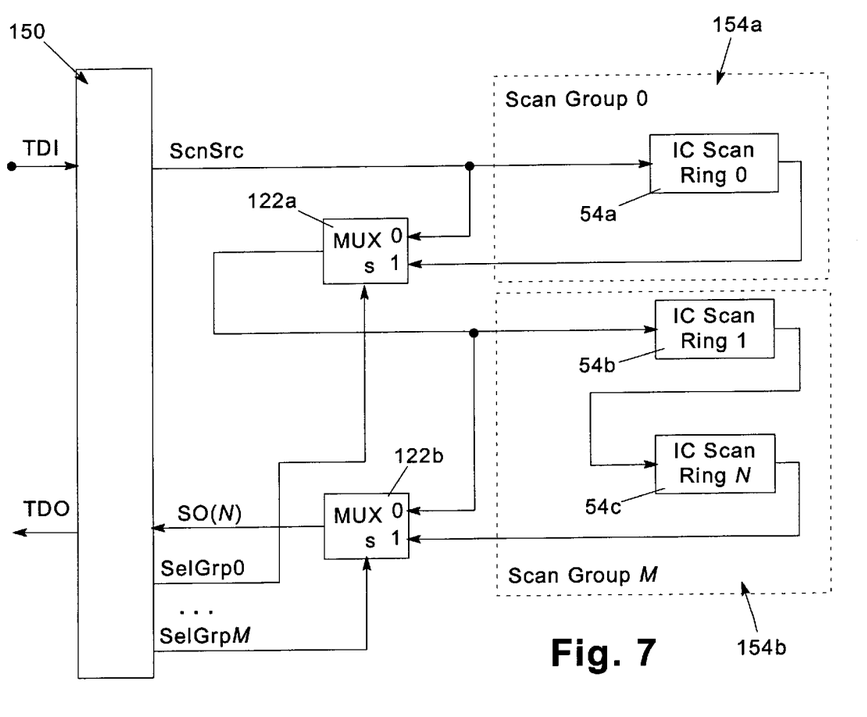
FIG. 7 is a block diagram illustrating a second configurable scan path arrangement for the grey box of FIG. 5.
Figure 8:
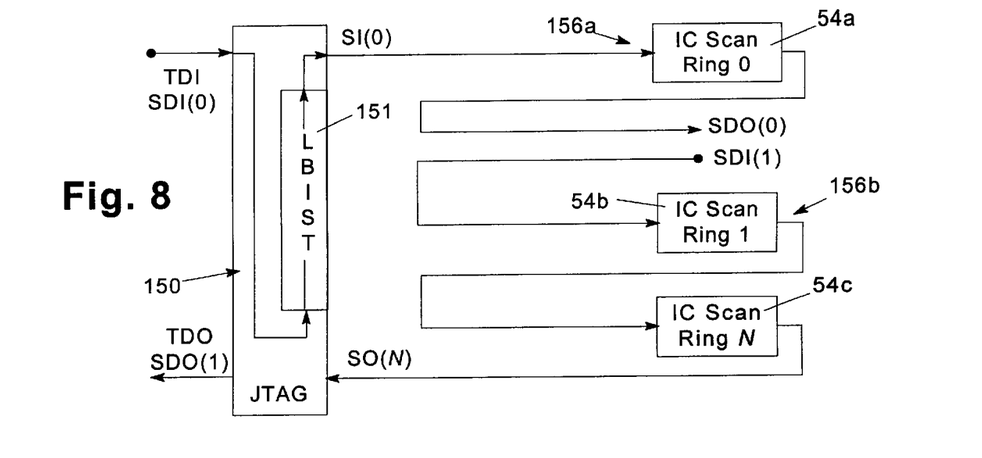
FIG. 8 is a block diagram illustrating a third configurable scan path arrangement for the grey box of FIG. 5.

FIGS. 6–8 illustrate the three primary modes of operation for grey box 120 in configuring alternate scan paths through the various scan ring segments 54a–54c. The various modes of operation are selected in response to the state of the POR/BISTmode and SCANmode signals, as illustrated in Table I below:

TABLE I

Grey Box Modes of Operation

| SCANmode | POR/BISTmode | Grey Box Mode |
| --- | --- | --- |
| 1 | Don't care | External Scan Mode |
| 0 | 1 | POR/BIST Mode |
| 0 | 0 | Functional Mode |

It should also be appreciated that the POR and BIST modes of operation may be distinguished via separate enable signals for the respective modes, whereby four separate modes would be provided. In the alternative, POR and BIST modes may also be distinguished solely by what is input to the SI signals during operation in these modes.

FIG. 6 illustrates the POR/BIST mode of operation, where in response to selection of the POR/BISTmode signal with an inactive SCANmode signal, each of the N scan ring segments is independently connected between a pair of SI/SO scan interface pin pairs. This breaks the POR flush into N groups, speeding up the flush, and facilitates built-in self test utilizing an N-channel pseudo-random pattern generator (PRPG) and multiple input shift register (MISR) in LBIST 151 to reduce the time needed during LBIST operations. During POR, SI(0:N) may be driven to a flush-initialization value (0 or 1) through appropriate selection of the TDI multiplexer, while SO(0:N) may ignored. During LBIST, SI(0:N) may be driven by the PRPG in LBIST 151 while SO(0:N) are compressed into an MISR, in a manner well known in the art. As a result, parallel scan paths 152a, 152b and 152c are defined. It should also be appreciated that it may be desirable for this reason to configure each scan ring 54a, 54b and 54c to be approximately of the same length to maximize the efficiency of the parallel operations. It should also be appreciated that the LBIST implementation may vary, allowing alternate implementations to be inserted without altering the grey box structure. It may also not be desirable to utilize all N channels supplied by the grey box, whereby unused SI signals may be directly connected to their respective SO outputs.

Any number of LBIST implementations may be utilized, e.g., the implementations described in the aforementioned incorporated application. Such an implementation permits any selected channel defined by a particular SI/SO pair to be routed to the TDO signal for mid-test-pattern observation, e.g., through appropriate configuration of multiplexers 77 and 97 of FIG. 4.

FIG. 7 illustrates the operation of grey box 120 in a functional scan mode, where both the POR/BISTmode and SCANmode signals are inactive. When the device is operating in this mode, one or more of the scan ring segments may be scanned using a "building block" scheme using the select group signals. This reduces the scan controller complexity by using a bit-mapped approach. The granularity of grouping scan ring segments is configurable using the select group signals, ranging from M ring groups down to a single ring group. Typically, the scan ring segments are "grouped" by criteria such as shared functionality, common clock domain or structural organization (e.g., Global Register Arrays (GRA's), individual SRL's, ABIST latches, boundary scan latches, and combinations thereof). In the illustrated example of grey box 120, two ring groups are indicated, with a SelGrp0 signal selecting a first scan group 154a, and with a select group signal selecting a SelGrpM 154b for inclusion in a scan path defined between the TDI and TDO signals. Each of the functional multiplexers 122a, 122b selectively bypasses or includes its corresponding scan group within the data path defined between the ScnSrc signal and the last scan out signal SO(N). Specifically, with a multiplexer 122a or 122b inactive, the corresponding scan group there for is shunted by virtue of the input thereto being coupled to the output of the group.

It should be appreciated that any number and configuration of scan ring segments may be included in individual scan groups, with any number of multiplexers utilized to select each of the groups during the functional mode.

FIG. 8 illustrates the operation of grey box 120 in an external scan mode, which occurs in response to the selection of the SCANmode signal. It should be appreciated that this mode is useful during manufacture of an integrated circuit device to test the operation of manufactured components via an external IC tester. With the SCANmode signal active, the internal scan ring segments are organized into sets of external scan rings (e.g., scan rings 156a and 156b) using additional IC I/O pins reserved for that use. As discussed above, the TDI pin may double as the first SDI (external scan input) and the TDO may serve as the final SDO (external scan output). With the SCANmode signal active, multiplexer 130a (FIG. 5) breaks the path from SO(0) and scan ring segment 54b, instead supplying a second external scan input SDJ(1) to the segment. As such, external scanning may be performed in parallel via the two scan paths defined between corresponding SDI and SDO pins. As also illustrated by LBIST 151, the JTAG/LBIST logic may be configured as a scan ring pre-pended to scan ring 156a so that additional testing may be performed of scannable latches within the JTAB/LBIST logic, which would otherwise be untestable.

In an alternate arrangement, it may be desirable to configure the JTAB/LBIST logic in a separate external scan ring, e.g., using the TDI and TDO pins, with other external scan rings having separate dedicated I/O pins.

It should be appreciated that any number of scan ring segments, parallel scan paths, groups and arrangement of segments within groups may be utilized in any of the modes of operation by using suitable arrangements of multiplexers in the manner described herein. In one implementation, it may be desirable to utilize, for example, 62 SI/SO pairs with 18 select group signals. Other implementations may utilize other combinations of signals, multiplexers, and scan ring segments consistent with the invention.

Returning briefly to FIG. 3, one suitable manner of configuring grey box 120 via commands processed by instruction register 66 is described. It may be desirable to assign specific address offsets to various scan group segments. This may be performed, for example, using a modifier for the instructions processed by the instruction register. One suitable instruction register format receives 32-bit instructions, having a format including an 8-bit opcode and a 24-bit modifier with an LSB of "1" to provide odd parity for the instruction. Table II illustrates one suitable assignment for the various select groups and other internally accessible registers within the JTAG implementation.

TABLE II

IR Modifier Assignments

| IR Bits 8:31 | Assignment |
| --- | --- |
| x'000002' | Status Register. |
| x'000004' | Options Register. |
| x'000008' | 1-bit Bypass Register. |
| x'000010' | 32-bit Bypass Register. |
| x'000020' | CRC Register. |
| x'000040' | CSI Scan Register. |
| x'000080' | CSI Statas Register. |
| x'000100' | IDcode. |
| x'000200' | Version Level Constant. |
| x'000400' | LBIST Channel (selected inside LBIST Options Register). |
| x'800003' | SelGrp(0): Boundary scan ring 0. |
| x'800005' | SelGrp(1): Boundary scan ring 1. |
| x'800009' | SelGrp(2): Boundary scan ring 2. |
| x'800011' | SelGrp(3): Boundary scan ring 3. |
| x'800021' | SelGrp(4): Alternate clock domain scan-rings. |
| x'800041' | SelGrp(5): INT scan-rings. |
| x'800081' | SelGrp(6): REF scan-rings. |
| x'800101' | SelGrp(7): Not Used. |
| x'800201' | SelGrp(8): GRA Group 0 scan ring. |
| x'800401' | SelGrp(9): GRA Group 1 scan ring. |
| x'800801' | SelGrp(10): GRA Group 2 scan ring. |
| x'801001' | SelGrp(11): GRA Group 3 scan ring. |
| x'802001' | SelGrp(12): GRAMs/ABIST engine Group 0 scan ring. |
| x'804001' | SelGrp(13): GRAMs/ABIST engine Group 1 scan ring. |
| x'808001' | SelGrp(14): GRAMs/ABIST engine Group 2 scan ring. |
| x'810001' | SelGrp(15): GRAMs/ABIST engine Group 3 scan ring. |

TABLE II-continued

IR Modifier Assignments

| IR Bits 8:31 | Assignment |
| --- | --- |
| x'820001' | SelGrp(16): Not Used. |
| x'840001' | SelGrp(17): Not Used. |
| Bits 9:12 | CoreSel(0:3) for IC's with multiple cores. |

It should be appreciated that multiple select group signals may be OR'ed together to concatenate multiple scan rings, e.g., by performing an exclusive-OR operation on bits 8:31, then setting bit 8. It should be appreciated that the address assignments described above are not exclusive, and that other assignments may be utilized consistent with the invention. Moreover, various internal registers shown above are either dictated by the JTAG standard or are described in further detail in the aforementioned incorporated application.

Figure 9:
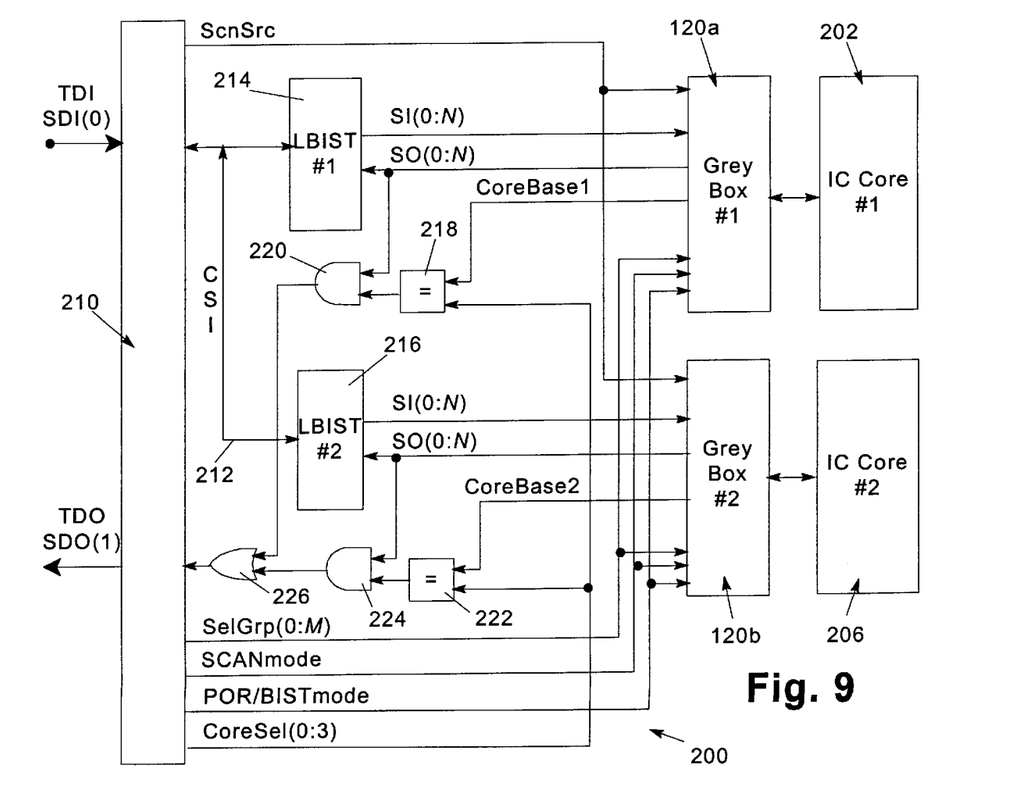
FIG. 9 is a block diagram of a multi-core circuit arrangement consistent with the invention, illustrating a multi-path scan interface for use therewith.

As discussed above, it may also be desirable to couple together the scan ring segments of multiple cores in a multi-core integrated circuit design. One suitable arrangement that permits parallel operation of the scan circuitry in multiple cores is illustrated in FIG. 9. With this configuration, a JTAG implementation 210 is coupled to multiple cores 202, 206 through a pair of grey boxes 120a, 120b, each of which may be configured in the same manner as grey box 120, described above in connection with FIG. 5, to form distinct core scan paths through the scan ring segments in each core. Each grey box receives the ScnSrc signal from block 210, as well as the SI/SO pairs from a pair of separate LBIST controllers 214, 216. The SelGrp, SCANmode and POR/BISTmode signals are coupled in parallel to each of the grey boxes, and a core select (CoreSel) signal is compared to the hard-wired CoreBase signals output from each grey box. Each LBIST 214, 216 is coupled over CSI bus 212 to block 210. With the configuration shown in FIG. 9, only one grey box 120a, 120b may be selected at a time, based upon the output of separate core select circuit arrangements for each core, each including a comparator 218, 222 coupled to an AND logic gate 220, 224. For each such arrangement, the core select signal is compared in the comparator block 218, 222 to the respective CoreBase identifier for the core. The output of the comparator 218, 222 is provided to the associated AND gate 220, 224, along with the last scan out signal SO(N) from the associated grey box. Accordingly, the comparators act as gates on the scan out signals from each grey box, so that the single output to the TDO signal via an OR gate 226 occurs only for the enabled grey box based upon the core select signal.

Figure 10:
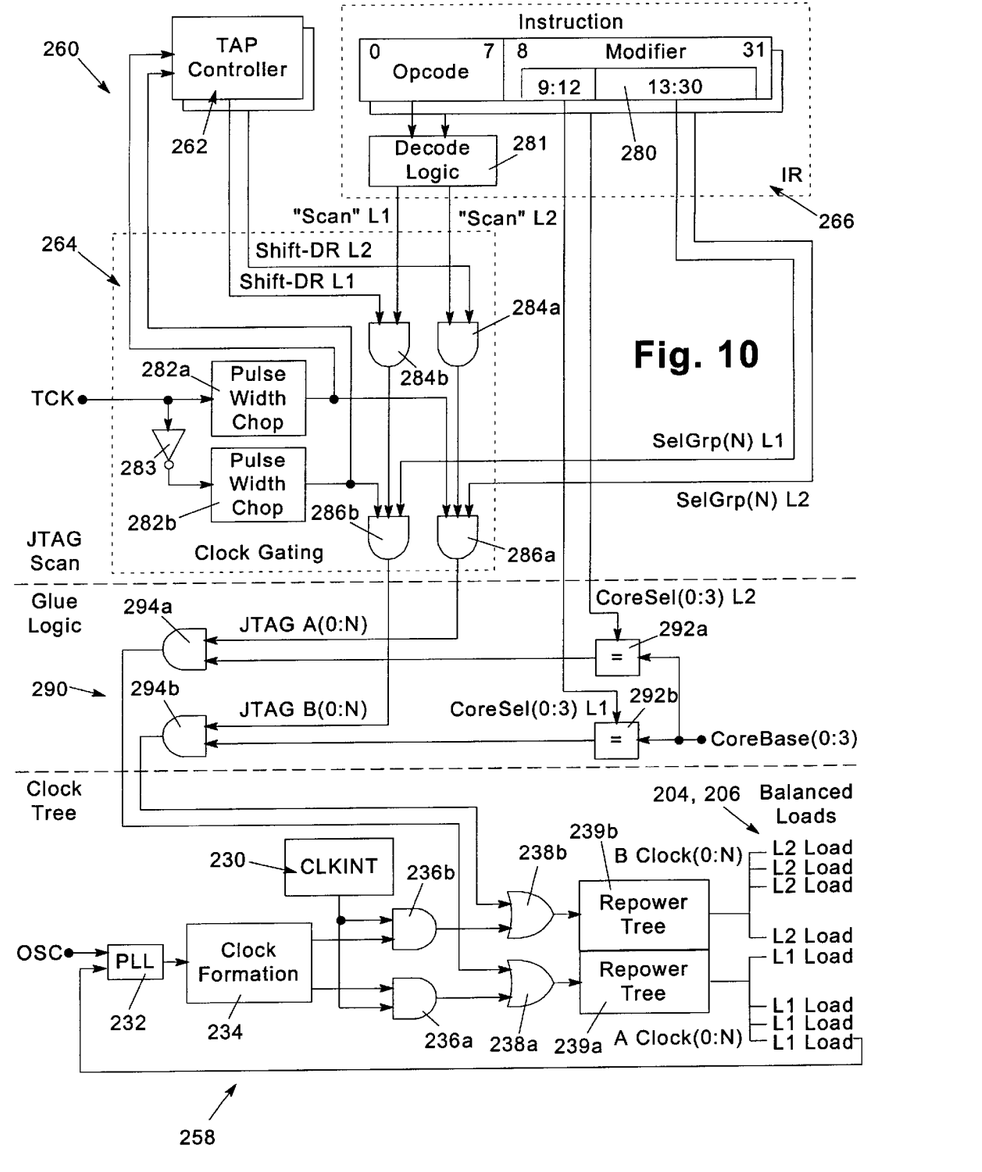
FIG. 10 is a block diagram illustrating the generation of clock signals from multiple sources consistent with the invention.

In concert with data path gating, it may also be necessary to provide clocks for multiple sources to the scan ring segments consistent with different modes of operation of a grey box. For example, FIG. 10 illustrates a suitable clock distribution circuit arrangement for the circuit arrangement of FIG. 9, for use with a two stage clocking system, designated L1 and L2, with the L1 clocks also referred to as "A" clocks and the L2 clocks referred to as "B" clocks. The circuit arrangement of FIG. 10 permits the selective distribution of either a service interface clock signal such as the JTAG TCK signal, or a functional clock signal such as a clock signal generated from the raw clock signal from the OSC input. A JTAG scan controller 260 is illustrated as interfaced with a clock tree 258 through glue logic 290, an arrangement that permits a wide variety of clocking signals for functional, scan, and other operations on an integrated circuit device.

Controller 260 includes a TAP controller 262 having a state machine defined by the IEEE 1149.1 Standard. A clock gating block 264 includes a pair of pulse width chop blocks 282a, 282b that are supplied respectively with active high and active low (by virtue of inverter 283) representations of the TCK signal from the JTAG bus. Block 282a outputs to an AND gate 286a that also receives the output of another AND gate 284a, as well as a SelGrp(N) L2 signal from the modifier portion of an instruction 280 stored in instruction register 266. AND gate 284a receives a "scan" L2 signal via decode of an opcode portion of instruction 280 through decode logic 281, as well as an L2 signal output from TAP controller 262 during the Shift-DR state thereof. Similarly, block 282b outputs to an AND gate 286b that also receives the output of another AND gate 284b and a SelGrp(N) L1 signal from the modifier portion of instruction 280. AND gate 284b receives a "scan" L1 signal via decode of the opcode portion of instruction 280, as well as an L1 signal output from TAP controller 262 during the Shift-DR state thereof.

Glue logic 290 includes a pair of AND gates 294a, 294b that respectively gate the JTAG A clock signal and JTAG B clock signal (output respectively from AND gates 286a, 286b) using compare signals output from a pair of comparators 292a, 292b. Each comparator receives a CoreBase(0:3) signal that identifies the core, as well an associated L2 or L1 CoreSel(0:3) signal from the modifier portion of instruction 280.

Clock tree 258 includes a phase locked loop (PLL) block 232 that receives the raw clock signal for the integrated circuit device, as well as feedback from the balanced loads within cores 204, 206 (although other loads may also be present on the integrated circuit device). A clock formation block 234 receives the output of PLL 232 and generates A and B functional clock signals to a pair of AND gates 236a and 236b. Each AND gate 236a, 236b is gated by control signals output from a CLKINT clock interface CIU 230 coupled to the CSI bus. One suitable implementation of CIU 230 is described, for example, in the aforementioned incorporated application, wherein it is disclosed how the supply of A and B clock signals may be controlled via a JTAG command provided via an MIU, via a CSI command bounced from another CIU, or upon POR in a remote environment. The reader is therefore directed to the aforementioned incorporated application for a more detailed discussion of CIU 230.

A pair of OR gates 238a, 238b respectively receive the A and B clock signals output (for gate 238a) from AND gate 294a and AND gate 236a, and (for gate 238b) from AND gate 294b and AND gate 236b. The output of each gate is then fed to an associated repower tree block 239a, 239b for distribution to the balanced loads in core 204 and/or core 206 (as well as other logic circuitry on the integrated circuit device).

The above-described circuit arrangement provides an extremely flexible manner of distributing appropriate clock signals on an integrated circuit device. For example, during power on reset (POR), the scan clocks to all balanced loads, and in particular, to the scan ring segments, may be held active by CIU 230, allowing the flush-initialization data values on SI(0:N) to propagate through each scan ring segment. After POR completes the POR signal supplied CIU 230 (not shown in FIG. 10) goes inactive and remains inactive.

During LBIST, CIU 230 blocks the free-running system OSC clocks, and LBIST orders the release of clock sequences via bounce commands to CITJ 230 to scan test patterns generated by the PRPG through the scan ring segments, simultaneously scanning out previous ring data into the MISR.

When neither POR nor LBIST is active, a JTAG scan command may be loaded into the instruction register coupling the TCK signal to the scan ring segments selected by the command modifier during the Shift-DR state of the TAP controller. Glue logic 290 also limits coupling of the TCK signal only to the appropriate core designated in the JTAG scan command modifier.

When neither POR nor LBIST nor JTAG is active, CIU 230 may be ordered to start the free-running OSC system clocks for system operation via a JTAG command, or automatically upon detection that BIST has completed and the suitable mode configuration indicates an automatic IC startup.

It should be appreciated that the above-described clock configuration may also be suitable for use with single-core designs such as those described above with reference to FIGS. 2–8, e.g., by omitting the use of comparators 292a, 292b to gate AND gates 294a, 294b. Moreover, while the above-described configuration is implemented using a level sensitive scan design (LSSD) implementation, the invention may also be utilized with other forms of scannable logic, e.g., general scan design (GSD).

Figure 11:
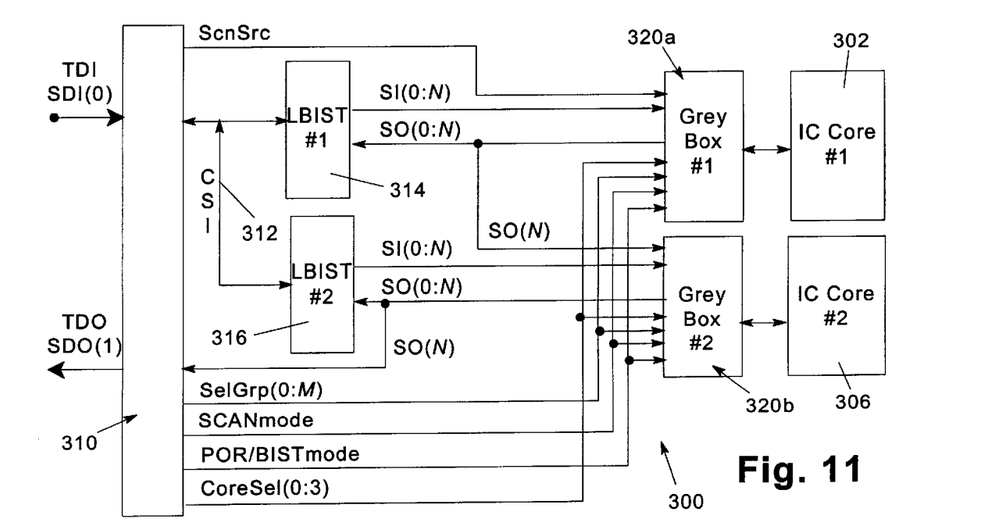
FIG. 11 is a block diagram of an another multi-core circuit arrangement consistent with the invention, illustrating a multi-path scan interface for use therewith.

It may also be desirable to support multiple cores using an alternate arrangement with the scan ring segments of each core coupled in series, rather than in parallel, whereby a single scan in/single scan out configuration is provided. This is in contrast to the configuration illustrated in FIG. 9, which operates as a parallel scan in, with a single scan out selection. This alternate configuration is illustrated at 300 in FIG. 11, wherein a JTAG block 310 is coupled to a pair of cores 302, 306 through a pair of grey boxes 320a and 320b. A pair of LBIST controllers 314, 316 are coupled to block 310 through CSI bus 312. Moreover, SI/SO pairs are coupled between each controller and its corresponding grey box, with common SelGrp, SCANmode, POR/BISTmode and CoreSel signals provided to each grey box. In the alternative, separate select signals may be provided to each grey box to separately configure each grey box as desired. The configuration illustrated in FIG. 11 differs from that of FIG. 9, however, in that, rather than supplying the ScnSrc signal to both grey boxes, only the first grey box 320a receives the ScnSrc signal. The scan source for the second grey box 320b is supplied via the last scan out signal SO(N) of the previous grey box. In addition, the last scan out SO(N) of grey box 320b is provided to block 310 thereby completing the serial path of grey boxes 320a, 320b.

Figure 12:
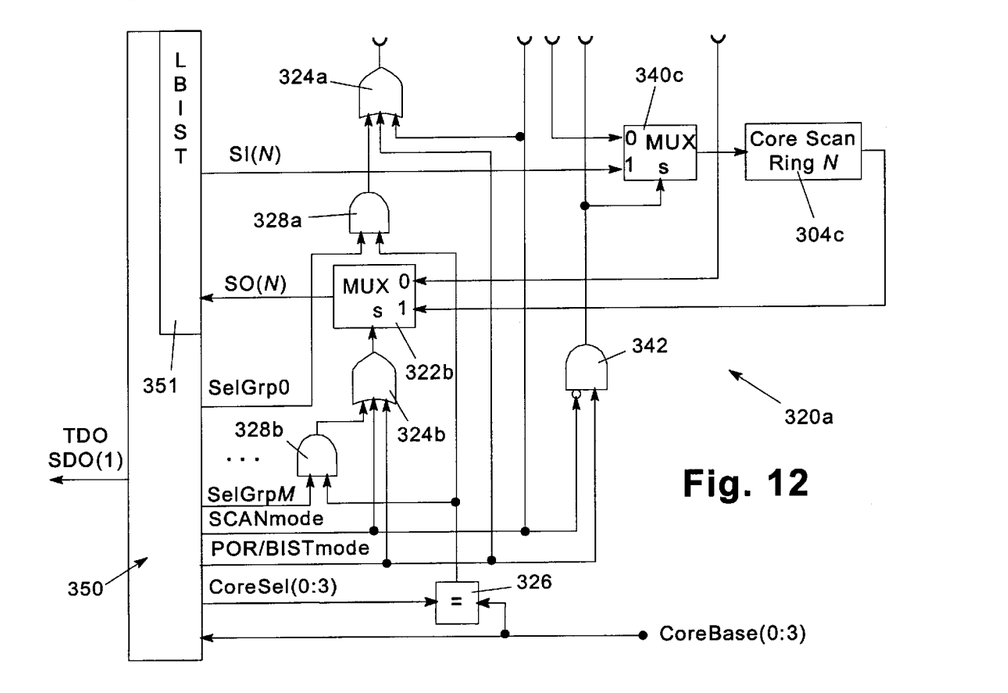
FIG. 12 is a block diagram illustrating in greater detail an alternate grey box to that of FIG. 5.

Turning to FIG. 12, grey box 320a is illustrated in greater detail. The grey box is configured substantially similarly to grey box 120 of FIG. 5, whereby multiplexer 322b, OR gates 324a and 324b, AND gate 342 and multiplexer 340c operate in substantially the same manner and in the same configuration as the corresponding components 122b, 124a, 124b, 142 and 140c of grey box 120 shown in FIG. 5. However, in grey box 320a, a comparator 326 is utilized to compare the CoreSel signal with the CoreBase assigned to grey box 320a, and output therefrom a compare signal to a pair of AND gates 328b and 328a that gate the SelGrp signals for the grey box. As such, if the CoreBase of grey box of 320a does not match that specified in the core select signals, the select group signals are disabled, thereby resulting in each scan ring segment in the core, e.g., scan ring segment 304c, being bypassed from the serial scan path in the functional mode. It may therefore be appreciated that a single interface may be utilized to scan the scan ring segments of multiple cores in a flexible and efficient manner.

It should be appreciated that in the configuration illustrated in FIG. 12, the scan ring segments of only one core may be selected at a time for inclusion in the serial scan path. However, in the alternative, it may be desirable to provide separate select signals that would permit the scan ring segments of multiple cores to be incorporated into the same serial scan path if desired.

Various additional modifications may be made to the illustrated embodiments without departing from the spirit and scope of the invention. Therefore, the invention lies solely in the claims hereinafter appended.

What is claimed is:

1. A circuit arrangement, comprising:
   (a) first and second scan ring segments, each scan ring segment including an input and an output; and
   (b) a multiplexer, coupled between the first and second scan ring segments, the multiplexer configured to selectively couple the output of the first scan ring segment to the input of the second scan ring segment, wherein in a first mode, the first and second scan ring segments operate in a common scan path, and in a second mode, the first and second scan ring segments operate in separate scan paths.

2. The circuit arrangement of claim 1, wherein the multiplexer includes first and second inputs and an output.

3. The circuit arrangement of claim 2, wherein the input of the first scan ring segment is configured to receive a first scan in signal, wherein the first input of the multiplexer is coupled to the output of the first scan ring segment, the output of the multiplexer is coupled to the input of the second scan ring segment, and the second input of the multiplexer is configured to receive a second scan in signal, wherein the multiplexer is configured to selectively operate in one of the first and second modes in response to a select signal, and wherein in the first mode the multiplexer couples the first input of the multiplexer to the output of the multiplexer, and in the second mode the multiplexer couples the second input of the multiplexer to the output of the multiplexer.

4. The circuit arrangement of claim 3, further comprising a second multiplexer, interposed between the first scan ring segment and the first multiplexer.

5. The circuit arrangement of claim 4, wherein the second multiplexer includes first and second inputs and an output, the first input of the second multiplexer coupled to the output of the first scan ring segment, the output of the second multiplexer coupled to the first input of the first multiplexer, and the second input of the second multiplexer configured to receive a third scan in signal.

6. The circuit arrangement of claim 4, wherein the second multiplexer includes first and second inputs and an output, the first input of the second multiplexer coupled to the output of the first scan ring segment, the second input of the second multiplexer coupled to the input of the first scan ring segment, and the output of the second multiplexer coupled to the first input of the first multiplexer, wherein the second multiplexer is configured to selectively operate in one of first and second modes in response to a second select signal, wherein in the second mode the second multiplexer couples the second input of the second multiplexer to the output of the second multiplexer and thereby bypasses the first scan ring segment.

7. The circuit arrangement of claim 4, further comprising a third multiplexer interposed between the output of the first scan ring segment and the second multiplexer.

8. The circuit arrangement of claim 3, further comprising:
   (a) a first logic gate including first and second inputs and an output, the first and second inputs of the first logic gate respectively configured to receive a parallel scan mode signal and an external scan mode signal, and the output of the first logic gate coupled to the first multiplexer to provide the select signal thereto, wherein the first multiplexer is configured to operate in the first mode in response to assertion of the parallel scan mode signal and deassertion of the external scan mode signal;
   (b) a second and third multiplexers, each including first and second inputs and an output, the first input of the second multiplexer coupled to the output of the first scan ring segment, the second input of the second multiplexer coupled to the input of the first scan ring segment, the output of the second multiplexer coupled to the first input of the third multiplexer, the second input of the third multiplexer configured to receive a third scan in signal, and the output of the third multiplexer coupled to the first input of the first multiplexer, wherein the third multiplexer is configured to pass the third scan in signal to the first input of the first multiplexer in response to assertion of the external scan mode signal; and
   (c) a second logic gate including first, second and third inputs and an output, the first and second inputs of the second logic gate respectively configured to receive the parallel scan mode signal and the external scan mode signal, the third input of the second logic gate configured to receive a scan group select signal, and the output of the second logic gate configured to output a select signal to the second multiplexer such that the second multiplexer couples the output of the first scan ring segment to the first input of the third multiplexer in response to assertion of any of the parallel scan mode signal, the external scan mode signal, and the scan group select signal.

9. The circuit arrangement of claim 3, further comprising a reset circuit arrangement, configured to respectively provide first and second flush signals to the input of the scan ring segment and the second input of the multiplexer, the reset circuit arrangement configured to configure the multiplexer in the second mode such that the first and second flush signals are concurrently scanned into the first and second scan ring segments.

10. The circuit arrangement of claim 3, wherein the first and second scan ring segments are respectively configured to generate first and second scan out signals at the outputs thereof, the circuit arrangement further comprising:
   (a) a pseudo-random pattern generator including first and second channels respectively configured to supply the first and second scan in signals to the first and second scan ring segments; and
   (b) a multiple input shift register including first and second channels respectively configured to receive the first and second scan out signals from the first and second scan ring segments.

11. The circuit arrangement of claim 10, further comprising a channel select multiplexer including first and second inputs coupled to the first and second channels of the multiple input shift register, the channel select multiplexer further including an output configured to output one of the first and second scan out signals in response to a channel select signal.

12. The circuit arrangement of claim 1, further comprising a service interface coupled to the multiplexer and the first and second scan ring segments, the service interface including a service access port coupled to the first and second scan ring segments.

13. The circuit arrangement of claim 12, wherein the service interface includes a test access port controller, the test access port controller including a test data input/output partition configured to receive a test data in signal from the service access port and provide the test data in signal as the first scan in signal, and to output a test data out signal through the service access port using the scan out signal.

14. The circuit arrangement of claim 12, further comprising a clock distribution circuit arrangement configured to supply at least one clock signal to the first and second scan ring segments, the clock distribution circuit arrangement configured to receive a service interface clock signal from the service interface and a functional clock signal.

15. The circuit arrangement of claim 14, further comprising first and second cores, wherein the clock distribution circuit arrangement includes at least one comparator configured to compare a core select signal generated by the service interface with a core identifier for each of the first and second cores, and to output a comparison signal that selectively gates the service interface clock signal.

16. A circuit arrangement, comprising:
   (a) a scan in port and a scan out port defining a scan path therebetween;
   (b) a scan ring group disposed within the scan path between the scan in port and the scan out port, the scan ring group including an input and an output and at least a first scan ring segment with an input and an output;
   (c) a second scan ring segment with an input and an output, the second scan ring segment disposed in the scan path between the scan ring group and one of the scan in and scan out ports;
   (d) a first multiplexer, including first and second inputs and an output, the first and second inputs of the first multiplexer respectively coupled to the input and output of the scan ring group, and the output of the first multiplexer coupled to one of the input of the second scan ring segment and the scan out port, wherein in a first mode, the first multiplexer couples the first input to the output to bypass the scan ring group from the scan path, and in a second mode, the first multiplexer couples the second input to the output to include the scan ring group in the scan path;
   (e) a third scan ring segment; and
   (f) a second multiplexer coupled between the second scan ring segment and the third scan ring segment, the second multiplexer configured to selectively couple the output of the second scan ring segment to the third scan ring segment, wherein in a first mode of the second multiplexer, the third scan ring segment operates in the same scan path as the second scan ring segment, and in a second mode of the second multiplexer, the third scan ring segment operates in a separate scan path from the second scan ring segment.

17. The circuit arrangement of claim 16, wherein the first scan ring segment is the only scan ring segment in the scan ring group.

18. The circuit arrangement of claim 16, wherein the scan ring group includes at least one additional scan ring segment.

19. The circuit arrangement of claim 16, further comprising a third multiplexer including first and second inputs and an output, the first and second inputs of the third multiplexer respectively coupled to an input and an output of a second scan ring group including at least one scan ring segment, wherein in a first mode, the third multiplexer couples the first input of the third multiplexer to the output of the third multiplexer to bypass the second scan ring group from the scan path, and in a second mode, the third multiplexer couples the second input of the third multiplexer to the output of the third multiplexer to include the second scan ring group in the scan path.

20. The circuit arrangement of claim 19, wherein the second scan ring segment is disposed in the second scan ring group.

21. The circuit arrangement of claim 20, wherein the first and second scan ring groups are disposed in the same core.

22. The circuit arrangement of claim 20, wherein the first and second scan ring groups are respectively disposed in first and second cores, and wherein the first and third multiplexers are respectively responsive to first and second scan group select signals, the circuit arrangement further comprising:
   (a) first and second logic gates, the first logic gate coupled between the first scan group select signal and the first multiplexer, the second logic gate coupled between the second scan group select signal and the third multiplexer; and
   (b) first and second comparators respectively coupled to the first and second logic gates to selectively gate the first and second scan group select signals, the first comparator configured to receive a core select signal and a first core identifier for the first core and output therefrom a first gate signal that passes the first scan group select signal to the output of the first logic gate, and the second comparator configured to receive the core select signal and a second core identifier for the second core and output therefrom a second gate signal that passes the second scan group select signal to the output of the second logic gate.

23. The circuit arrangement of claim 19, wherein the first and second scan ring groups are respectively disposed in core scan paths in first and second cores, each core scan path including an input and an output, the circuit arrangement further comprising first and second core select circuit arrangements respectively coupled to the outputs of the core scan paths in the first and second cores, the first and second core select circuit arrangements respectively configured to couple one of the outputs of the core scan paths in the first and second cores to the scan out port in response to a core select signal.

24. The circuit arrangement of claim 23, wherein the first core select circuit arrangement includes:
   (a) a comparator coupled to receive the core select signal and a core identifier for the first core and output therefrom a gate signal; and
   (b) a logic gate coupled between the output of the core scan path for the first core, the logic gate configured to selectively gate the output of the core scan path for the first core in response to the gate signal from the comparator.

25. The circuit arrangement of claim 16, further comprising:
   (a) a plurality of multiplexers, each configured to selectively bypass one of a plurality a scan ring groups disposed within the scan path; and
   (b) a scan path register including a plurality of bits, wherein each of the plurality of bits in the scan path register is coupled to a select signal in one of the plurality of multiplexers.

26. A data processing system, comprising:
(a) a processing unit coupled to a storage unit through a bus; and
(b) an integrated circuit device disposed in one of the processing and storage units, the integrated circuit device including:
  (1) first and second scan ring segments, each scan ring segment including an input and an output; and
  (2) a multiplexer, coupled between the first and second scan ring segments, the multiplexer configured to selectively couple the output of the first scan ring segment to the input of the second scan ring segment, wherein in a first mode, the first and second scan ring segments operate in a common scan path, and in a second mode, the first and second scan ring segments operate in separate scan paths.

27. A data processing system, comprising:
(a) a processing unit coupled to a storage unit through a bus; and
(b) an integrated circuit device disposed in one of the processing and storage units, the integrated circuit device including:
  (1) a scan in port and a scan out port defining a scan path therebetween;
  (2) a scan ring group disposed within the scan path between the scan in port and the scan out port, the scan ring group including an input and an output and at least a first scan ring segment with an input and an output;
  (3) a second scan ring segment with an input and an output, the second scan ring segment disposed in the scan path between the scan ring group and one of the scan in and scan out ports;
  (4) a first multiplexer, including first and second inputs and an output, the first and second inputs of the first multiplexer respectively coupled to the input and output of the scan ring group, and the output of the first multiplexer coupled to one of the input of the second scan ring segment and the scan out port, wherein in a first mode, the first multiplexer couples the first input to the output to bypass the scan ring group from the scan path, and in a second mode, the first multiplexer couples the second input to the output to include the scan ring group in the scan path;
  (5) a third scan ring segment; and
  (6) a second multiplexer coupled between the second scan ring segment and the third scan ring segment, the second multiplexer configured to selectively couple the output of the second scan ring segment to the third scan ring segment, wherein in a first mode of the second multiplexer, the third scan ring segment operates in the same scan path as the second scan ring segment, and in a second mode of the second multiplexer, the third scan ring segment operates in a separate scan path from the second scan ring segment.

28. A program product, comprising:
(a) a hardware definition program that defines a circuit arrangement, the circuit arrangement including:
  (1) first and second scan ring segments, each scan ring segment including an input and an output; and
  (2) a multiplexer, coupled between the first and second scan ring segments, the multiplexer configured to selectively couple the output of the first scan ring segment to the input of the second scan ring segment, wherein in a first mode, the first and second scan ring segments operate in a common scan path, and in a second mode, the first and second scan ring segments operate in separate scan paths; and
(b) a signal bearing media bearing the hardware definition program.

29. The program product of claim 28, wherein the signal bearing media is transmission type media.

30. The program product of claim 28, wherein the signal bearing media is recordable media.

31. A program product, comprising:
(a) a hardware definition program that defines a circuit arrangement, the circuit arrangement including:
  (1) a scan in port and a scan out port defining a scan path therebetween;
  (2) a scan ring group disposed within the scan path between the scan in port and the scan out port, the scan ring group including an input and an output and at least a first scan ring segment with an input and an output;
  (3) a second scan ring segment with an input and an output, the second scan ring segment disposed in the scan path between the scan ring group and one of the scan in and scan out ports;
  (4) a first multiplexer, including first and second inputs and an output, the first and second inputs of the first multiplexer respectively coupled to the input and output of the scan ring group, and the output of the first multiplexer coupled to one of the input of the second scan ring segment and the scan out port, wherein in a first mode, the first multiplexer couples the first input to the output to bypass the scan ring group from the scan path, and in a second mode, the first multiplexer couples the second input to the output to include the scan ring group in the scan path;
  (5) a third scan ring segment; and
  (6) a second multiplexer coupled between the second scan ring segment and the third scan ring segment, the second multiplexer configured to selectively couple the output of the second scan ring segment to the third scan ring segment, wherein in a first mode of the second multiplexer, the third scan ring segment operates in the same scan path as the second scan ring segment, and in a second mode of the second multiplexer, the third scan ring segment operates in a separate scan path from the second scan ring segment;
(b) a signal bearing media bearing the hardware definition program.

32. The program product of claim 31, wherein the signal bearing media is transmission type media.

33. The program product of claim 31, wherein the signal bearing media is recordable media.

34. A method of interfacing with first and second scan ring segments, each of which includes an input and an output, and the first scan ring segment configured to receive a first scan in signal, the method comprising:
(a) operating the first and second scan ring segments in a common scan path by configuring a multiplexer to selectively couple the output of the first scan ring segment to the input of the second scan ring segment; and
(b) operating the first and second scan ring segments in separate scan paths by configuring the multiplexer to selectively couple the input of the second scan ring segment to receive a second scan in signal.

35. A method of interfacing with a plurality of scan ring segments disposed within a first scan path defined between a scan in port and a scan out port, each scan ring segment including an input and an output, a first scan ring segment in the plurality of scan ring segments disposed within a scan ring group including an input and an output, a second scan ring segment in the plurality of scan ring segments disposed in the first scan path between the scan ring group and one of the scan in and scan out ports, the method comprising:

(a) including the scan ring group in the first scan path by configuring a first multiplexer to couple the output of the scan ring group to one of the input of the second scan ring segment and the scan out port;

(b) bypassing the scan ring group from the first scan path by configuring the first multiplexer to couple the input of the scan ring group to the one of the input of the second scan ring segment and the scan out port;

(c) including the third scan ring segment in the first scan path by configuring a second multiplexer to selectively couple the output of the second scan ring segment to the input of the second scan ring segment; and (d) operating the third scan ring segment in a second scan path by configuring the second multiplexer to selectively couple the input of the third scan ring segment to receive an alternate scan in signal.

36. A circuit arrangement, comprising:

(a) a scan in port and a scan out port defining a scan path therebetween;

(b) a scan ring group disposed within the scan path between the scan in port and the scan out port, the scan ring group including an input and an output and at least a first scan ring segment with an input and an output;

(c) a second scan ring segment with an input and an output, the second scan ring segment disposed in the scan path between the scan ring group and one of the scan in and scan out ports;

(d) a first multiplexer, including first and second inputs and an output, the first and second inputs of the first multiplexer respectively coupled to the input and output of the scan ring group, and the output of the first multiplexer coupled to one of the input of the second scan ring segment and the scan out port, wherein in a first mode, the first multiplexer couples the first input to the output to bypass the scan ring group from the scan path, and in a second mode, the first multiplexer couples the second input to the output to include the scan ring group in the scan path; and (e) a second multiplexer including first and second inputs and an output, the first and second inputs of the second multiplexer respectively coupled to an input and an output of a second scan ring group including at least one scan ring segment, wherein in a first mode, the second multiplexer couples the first input of the second multiplexer to the output of the second multiplexer to bypass the second scan ring group from the scan path, and in a second mode, the second multiplexer couples the second input of the second multiplexer to the output of the second multiplexer to include the second scan ring group in the scan path.

37. A circuit arrangement, comprising:

(a) a scan in port and a scan out port defining a scan path therebetween;

(b) a scan ring group disposed within the scan path between the scan in port and the scan out port, the scan ring group including an input and an output and at least a first scan ring segment with an input and an output;

(c) a second scan ring segment with an input and an output, the second scan ring segment disposed in the scan path between the scan ring group and one of the scan in and scan out ports;

(d) a multiplexer, including first and second inputs and an output, the first and second inputs of the multiplexer respectively coupled to the input and output of the scan ring group, and the output of the multiplexer coupled to one of the input of the second scan ring segment and the scan out port, wherein in a first mode, the multiplexer couples the first input to the output to bypass the scan ring group from the scan path, and in a second mode, the multiplexer couples the second input to the output to include the scan ring group in the scan path;

(e) a plurality of multiplexers, each configured to selectively bypass one of a plurality of scan ring groups disposed within the scan path; and (f) a scan path register including a plurality of bits, wherein each of the plurality of bits in the scan path register is coupled to a select signal in one of the plurality of multiplexers.

* * * * *